United States Patent
Shabde et al.

(10) Patent No.: US 6,348,356 B1
(45) Date of Patent: Feb. 19, 2002

(54) METHOD AND APPARATUS FOR DETERMINING THE ROBUSTNESS OF MEMORY CELLS TO ALPHA-PARTICLE/ COSMIC RAY INDUCED SOFT ERRORS

(75) Inventors: Sunil Narayan Shabde, Cupertino; Richard C. Blish, II; Donald L. Wollesen, both of Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/664,636

(22) Filed: Sep. 19, 2000

Related U.S. Application Data

(62) Division of application No. 09/164,421, filed on Sep. 30, 1998, now Pat. No. 6,204,516.

(51) Int. Cl.[7] ........................... G01R 31/26; H01L 21/66

(52) U.S. Cl. ........................... 438/14; 438/14; 438/18; 438/48; 438/56; 438/57; 257/48; 257/53; 257/428; 257/429

(58) Field of Search ................ 438/14–18, 48, 438/56, 57; 257/48, 53, 428–429

(56) References Cited

U.S. PATENT DOCUMENTS

| | | | | |
|---|---|---|---|---|
| 6,026,011 A | * | 9/1998 | Zhang | 365/154 |
| 6,204,516 B1 | * | 9/1998 | Shabde et al. | 257/48 |
| 5,905,290 A | * | 5/1999 | Houston | 257/380 |
| 6,067,656 A | * | 5/2000 | Rusu et al. | 714/768 |
| 6,075,261 A | * | 6/2000 | Hossain et al. | 257/252 |

OTHER PUBLICATIONS

Douseki et al. "Soft error immunity of 1–volt CMOS memory cells with MTCMOS technology" Proc. IEEE 1995 Int. Conference on Miclectronic test structures. vol. 8 3/95 p. 107–111.*

Lee et al. "Static noise margin and soft–error rate simulations for thin film transistor cell stability in a 4 mbit SRAM design" 0–7803–2570 2/95 IEEE p. 937–940.*

* cited by examiner

Primary Examiner—Matthew Smith
Assistant Examiner—Granvill Lee
(74) Attorney, Agent, or Firm—Mikio Ishimaru

(57) ABSTRACT

Method for determining the robustness of a device to soft errors generated by alpha-particle and/or cosmic ray strikes. In one embodiment, the method includes the steps of estimating energies of the alpha-particle and/or cosmic ray strikes; computing a number of electron-hole pairs generated for a predetermined distance of travel by the alpha-particle and/or cosmic ray into the device based on the estimated energies; computing the absorption coefficient in silicon for a light pulse with a predetermined wavelength; computing a first pulse width/intensity for the light pulse to generate the number of electron-hole pairs for the predetermined distance of travel by the light pulse into the device; producing the light pulse, the light pulse having a light pulse energy which is controlled by a pulse width and an intensity, wherein the pulse width/intensity is at a second pulse width/intensity which is less than the first pulse width/intensity and the light pulse energy is at a first light pulse energy which is low enough to avoid generating soft errors in the device; applying the light pulse to the device at a predetermined location; varying the light pulse energy to a second light pulse energy to generate a soft error; and detecting soft errors in the device. The present invention additionally provides an inexpensive method that would accurately simulate an alpha-particle and/or cosmic ray strike in predetermined areas of a memory cell.

12 Claims, 6 Drawing Sheets

METHOD AND APPARATUS FOR DETERMINING THE ROBUSTNESS OF MEMORY CELLS TO ALPHA-PARTICLE/COSMIC RAY INDUCED SOFT ERRORS

CROSS REFERENCE TO RELATED APPLICATION(S)

This is a divisional of application Ser. No. 09/164,421 filed Sep. 30, 1998 now U.S. Pat. No. 6,204,516.

TECHNICAL FIELD

The present invention relates generally to semiconductors and more specifically to soft errors induced by alpha-particles/cosmic ray in memory cells.

BACKGROUND ART

Storage of data and instructions in a memory structure is necessary to virtually any data processor application. For this reason, among others, the development of high-performance memory structures has accompanied the development of data processing circuits and integrated microprocessors in particular. Thus, as integration density and processing power of microprocessors has increased, the same attributes have been sought in storage per chip as well as to increase speed of the memory structure.

Memory structures are often considered to fall into one of two groups: static memories and dynamic memories.

Highest memory read access speed is achieved by static random access memories (SRAMs). In such static memories, the data are stored in a bistable latch (or flip flop) comprised of active circuits. Therefore, no time is required for either refresh or other operations to restore charge after reading.

While bipolar, n-channel, or p-channel SRAMs are not generally regarded as relying on stored charge (since, in normal operations, any charge lost through reading or leakage is continually replaced by operation of the active bistable circuit there), when implemented with complementary field effect transistors, voltages present on various nodes, such as the drain nodes, may cause storage of charge in a depletion region within or around a portion of the field effect transistors.

If an energetic particle from the environment, such as an alpha-particle, strikes a junction, such as the drain junction, surrounded by such a depletion region, electrons and holes will be generated within the underlying body of semiconductor material and will collect along the boundary of the depletion region. If the energetic particle strikes a junction (e.g. the drain junction of an N-type transistor) holding a charge in a depletion region, the size of the depletion region, the stored charge, and the voltage across the junction will be reduced by the charge perturbation. Similarly, if an energetic particle strikes a junction of a P-type transistor at low voltage, the charge perturbation will cause the stored charge and the voltage to be increased. Thus, if the charge perturbation is sufficiently large, the stored logic state may be reversed. This is commonly referred to as a "soft error" since the error is not due to a hardware defect and the cell will operate normally thereafter (although it may contain erroneous data until rewritten). Soft errors are increased by stand-by operation at reduced voltage.

Dynamic random access memories (DRAMs) offer the greatest potential for reduction of cell size since a DRAM cell typically includes only one transistor and a smaller storage capacitance. Therefore, DRAMs have the potential for the greatest amount of storage per chip. Power consumption is also relatively low. On the other hand, a storage capacitor is used as the storage mechanism and since some degree of leakage is unavoidable in any storage structure, the stored charge representing the stored data must be refreshed periodically. This requirement for periodic refreshing of stored data causes some periods during which the DRAM cell is not available to be read and thus increases the average cycle time and effectively reduces the speed of the response of the memory.

If an energetic particle from the environment, such as an alpha-particle, strikes a junction, such as the drain junction of a DRAM cell, electrons and holes will be generated near the drain region causing leakage current to flow to the ground. The leakage current will discharge the storage capacitor. Generally, when the storage capacitor is charged, the DRAM cell is at a high logic level and when the storage capacitor is discharged, the DRAM is at a low logic level. Accordingly, an alpha-particle strike can cause the logic level of the DRAM cell to change from a high logic level to a low logic level. Therefore, there will be a loss of data stored, an error, in the DRAM cell between refreshed cycles.

Alpha-particles can induce similar soft error problems in semiconductor memory cells that are embedded in microprocessor or other logic circuits.

A performance parameter of an SRAM cell is the critical charge, $Q_c$, which is the amount of charge that will cause a logic state reversal of the latch by causing a sufficiently large voltage disturbance. In the case of a DRAM cell, $Q_c$ is the amount of charge which will cause a logic state reversal by causing a sufficiently large leakage current to flow that will discharge the storage capacitor. Unfortunately, both miniaturization and lowered operating voltage (for example, the migration to 3.3 volt and beyond devices) of SRAM and DRAM cells with higher integration densities and/or lowered operating voltages also reduce the value of $Q_c$ for stable operation of the memory cells. Accordingly, SRAMs and DRAMs have become increasingly vulnerable to soft errors. Many attempts have been made to simulate the alpha-particle strikes in memory cells in efforts to determine their robustness to alpha-particle induced soft errors.

However, many of these attempts to determine the robustness of a device to alpha-particle induced soft errors involve tedious and burdensome methods to generate alpha-particles. Focused alpha-particle sources, such as a lead-encased source, are very expensive, huge in size, and considered hazardous due to radioactivity. A focused alpha-particle beam requires a room-sized accelerator and comprehensive shielding. Therefore, such alpha-particle sources are not allowed, nor are they of a size that can be accommodated, in a typical semiconductor manufacturing facility or laboratory where the determination of device robustness to alpha-particles would normally be done. Where smaller alpha-particle sources are available, they are subject to OSHA (Occupational Safety and Health Agency) licensing. In both cases, the sources provide radiation hazard risk.

Another drawback of using a conventional alpha-particle source is the inability to control the direction of strike of the alpha-particles. The alpha-particles travel in random directions and are not controllable so that they cannot be directed to strike predetermined locations, such as the drain junctions of transistors in a memory cell. Absent such directional control, the resulting alpha-particle induced soft errors can not be reproduced. This makes duplication of alpha-particle effects unrepeatable.

An inexpensive method and apparatus having a smaller size that would simulate an alpha-particle strike in predetermined areas of a memory cell with directional control and repeatable results, has long been sought, but has eluded those skilled in the art.

DISCLOSURE OF THE INVENTION

The present invention provides a method for determining the robustness of a device to soft errors generated by alpha-particle and/or cosmic ray strikes by estimating energies of the alpha-particle and/or cosmic ray strikes; computing a number of electron-hole pairs generated for a predetermined distance of travel by the alpha-particle and/or cosmic ray into the device based on said estimated energies; computing the absorption coefficient in silicon for a light pulse with a predetermined wavelength; computing a first pulse width for said light pulse to generate said number of electron-hole pairs for said predetermined distance of travel by said light pulse into the device; producing said light pulse, said light pulse having a light pulse energy which is controlled by a pulse width and an intensity, wherein said pulse width/intensity is at a second pulse width/intensity which is less than said first pulse width/intensity and said light pulse energy is at a first light pulse energy which is low enough to avoid generating soft errors in the device; applying said light pulse to the device at a predetermined location; varying said light pulse energy to a second light pulse energy to generate a soft error; and detecting soft errors in the device.

The present invention additionally provides inexpensive methods and apparatus that would accurately simulate an alpha-particle and/or cosmic ray strike in predetermined areas of a memory cell.

The above and additional advantages of the present invention will become apparent to those skilled in the art from a reading of the following detailed description when taken in conjunction with the accompanying drawings.

BEST MODES FOR CARRYING OUT THE INVENTION

Figure 1:
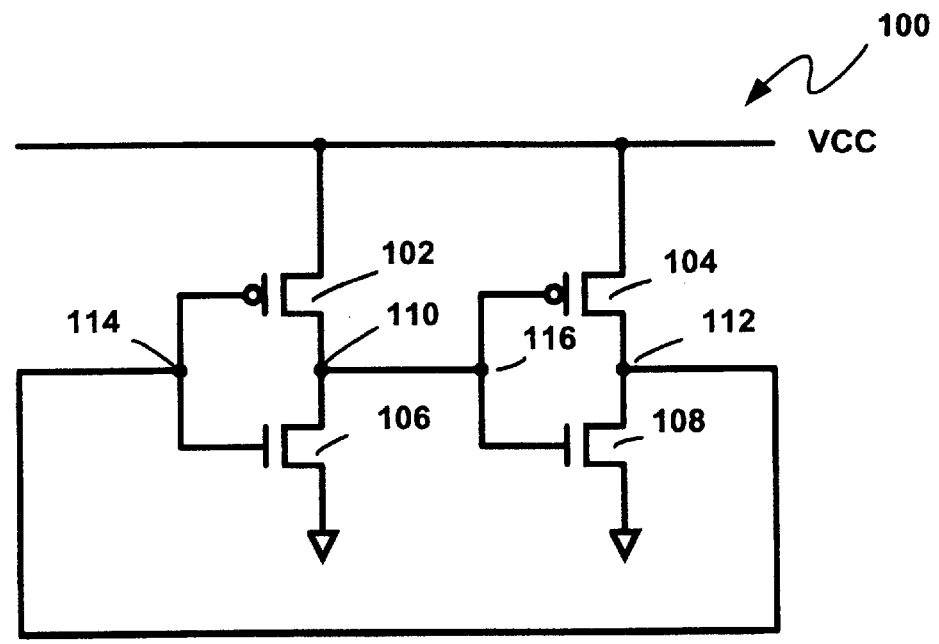
FIG. 1 is a schematic diagram of a SRAM cell.

Referring now to FIG. 1, therein is shown a schematic diagram of a SRAM cell 100. SRAM 100 includes P-channel transistors 102 and 104, and N-channel transistors 106 and 108. The sources of the P-channel transistors 102 and 104 are coupled to $V_{CC}$. The sources of the N-channel transistors 106 and 108 are coupled to ground. The drains of the P-channel transistor 102 and the N-channel transistor 106 are coupled to node 110. Similarly the drains is of the P-channel transistor 104 and the N-channel transistor 108 are coupled to node 112. The gates of the P-channel transistor 102 and the N-channel transistor 106 are coupled to node 114, which is coupled to node 112. The gates of the P-channel transistor 104 and the N-channel transistor 108 are coupled to node 116, which is coupled to node 110.

For the purposes of discussion, it will be assumed that node 112 is at a high logic level, which means that the P-channel transistor 104 is off and the N-channel transistor 108 is on. Furthermore, the P-channel transistor 102 is on and the N-channel transistor 106 is off.

When an alpha-particle with sufficient energy strikes node 110, the charges held at that node due to the gate capacitor of the N-channel transistor 108 will be discharged. This will cause the N-channel transistor 108 to be turned off, thereby changing the logic state at node 112 from a high logic level to a low logic level. This will cause a temporary data loss although there is no destruction to the memory cell itself.

Figure 2:
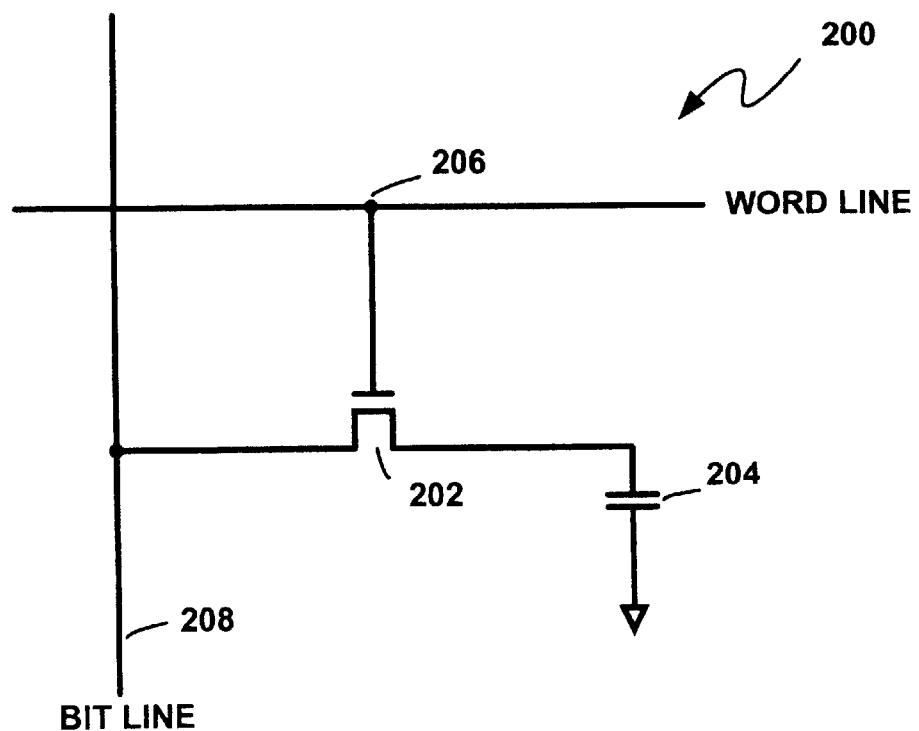
FIG. 2 is a schematic diagram of a DRAM cell.

Referring now to FIG. 2, therein is shown a schematic diagram of a DRAM cell 200. DRAM 200 includes a transistor 202 and a capacitor 204 for storing charges. The gate of the N-channel transistor 202 is coupled to a word line 206. The source of the N-channel transistor 202 is coupled to a bit line 208. The drain of the N-channel transistor 202 is coupled to one of the two electrodes of capacitor 204. The other electrode of capacitor 204 is coupled to ground. When capacitor 204 is charged, it represents a high logic level. On the other hand, when capacitor 204 is discharged, it represents a low logic level. For the purposes of discussion, it will be assumed that capacitor 204 is charged, i.e., it is at a high logic level. When an alpha-particle with sufficient energy strikes the drain side of the N-channel transistor 202, it will cause capacitor 204 to discharge, thereby changing its logic state from a high logic level to a low logic level. If that occurs, there will be a temporary loss of the bit of data stored in DRAM 200. This will cause a problem if there is a read before the lost data is restored during the next refresh cycle.

To simulate and determine the robustness of memory cells such as SRAM 100 or DRAM 200 to alpha-particle induced soft errors, it would be desirable to provide inexpensive To and safe methods and apparatus having a smaller size that could be accommodated in a typical semiconductor manufacturing facility or laboratory. In addition, the simulated alpha-particle must be controllable to strike predetermined locations in the memory cells, such as the drain junction of the N-channel transistor 106 in SRAM 100 or the drain junction of the N-channel transistor 202 in DRAM 200. The present invention provides such methods and apparatus.

Preferred embodiments of the present invention will now be described with reference to the drawings.

Figure 3:
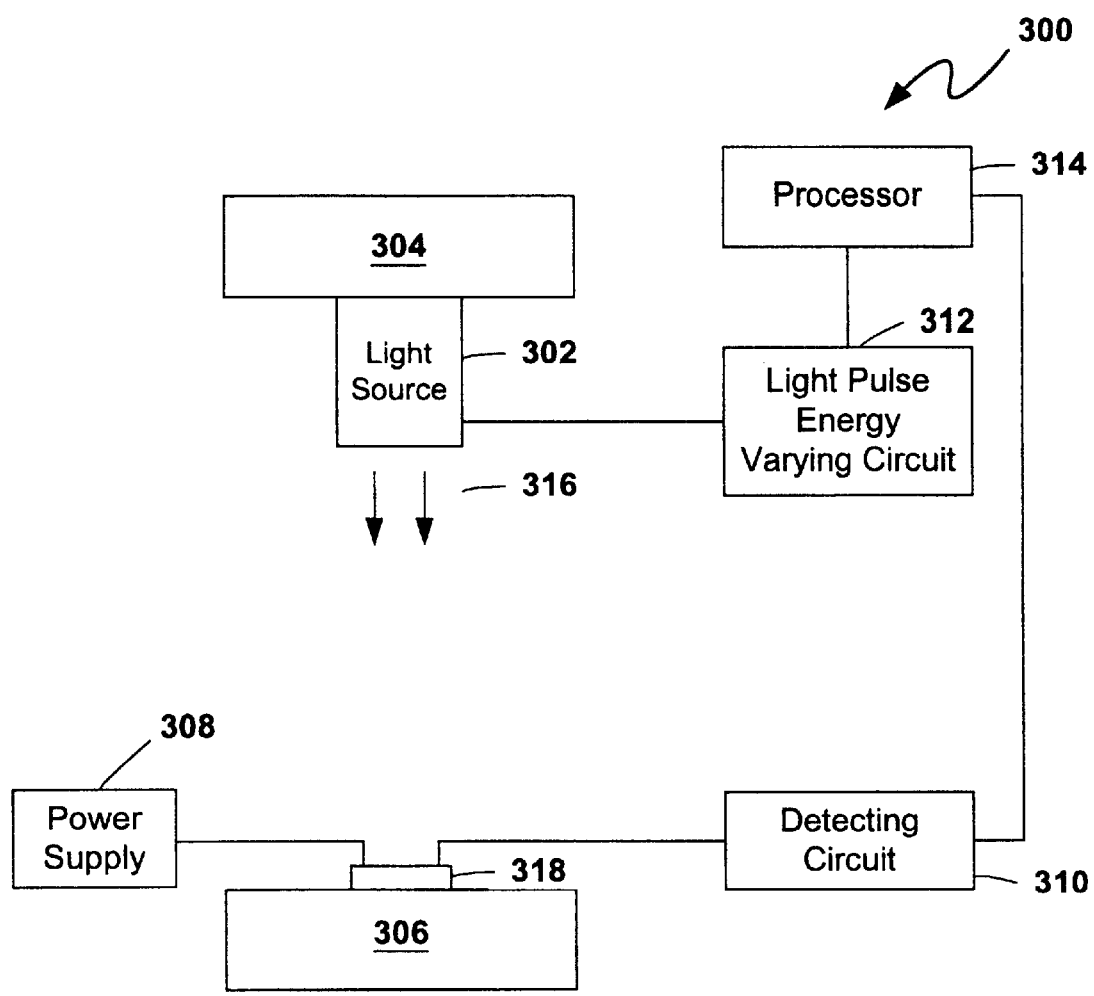
FIG. 3 is a simplified illustration of one embodiment of an apparatus for determining the robustness of a device to alpha-particle/cosmic ray induced soft errors in accordance with the present invention.

Referring now to FIG. 3, therein is shown an apparatus 300 constructed in accordance with the present invention which uses light pulses to strike at a predetermined location on the surface of a semiconductor device to simulate soft errors generated by alpha-particles and/or cosmic rays. The apparatus 300 includes a light source 302, a first fixture 304, a second fixture 306, a power supply 308, a detecting circuit 310, a light pulse energy varying circuit 312, and a processor 314. The light source 302 provides a light pulse 316 with a predetermined light pulse energy.

A semiconductor integrated circuit 318 is disposed on the second fixture 306. The first fixture 304 and the second fixture 306 can be movable relative to each other in the X, Y, Z, and θ position. The relative movement can be accomplished using conventional X-Y-Z-θ table technology. The power supply 308 is coupled to the integrated circuit 318 to provide power to the integrated circuit 318. The detecting circuit 310 is coupled to the integrated circuit 318 to detect the logic state of a memory device (not shown) within the integrated circuit 318. The light pulse energy varying circuit 312 is coupled to the light source 302 to vary the light pulse energy of light pulse 316 by changing the intensity and the pulse width of the light pulse 316. The processor 314 is coupled to the light pulse energy varying circuit 312 for controlling the light pulse energy varying circuit 312. The processor 314 is also coupled to receive the output of the detecting circuit 310. When the output of the detecting circuit 310 indicates a change in the logic state of the memory device, the processor 314 will record the corresponding intensity and pulse width of the light pulse 316 as provided by the light pulse energy varying circuit 312.

Figure 4:
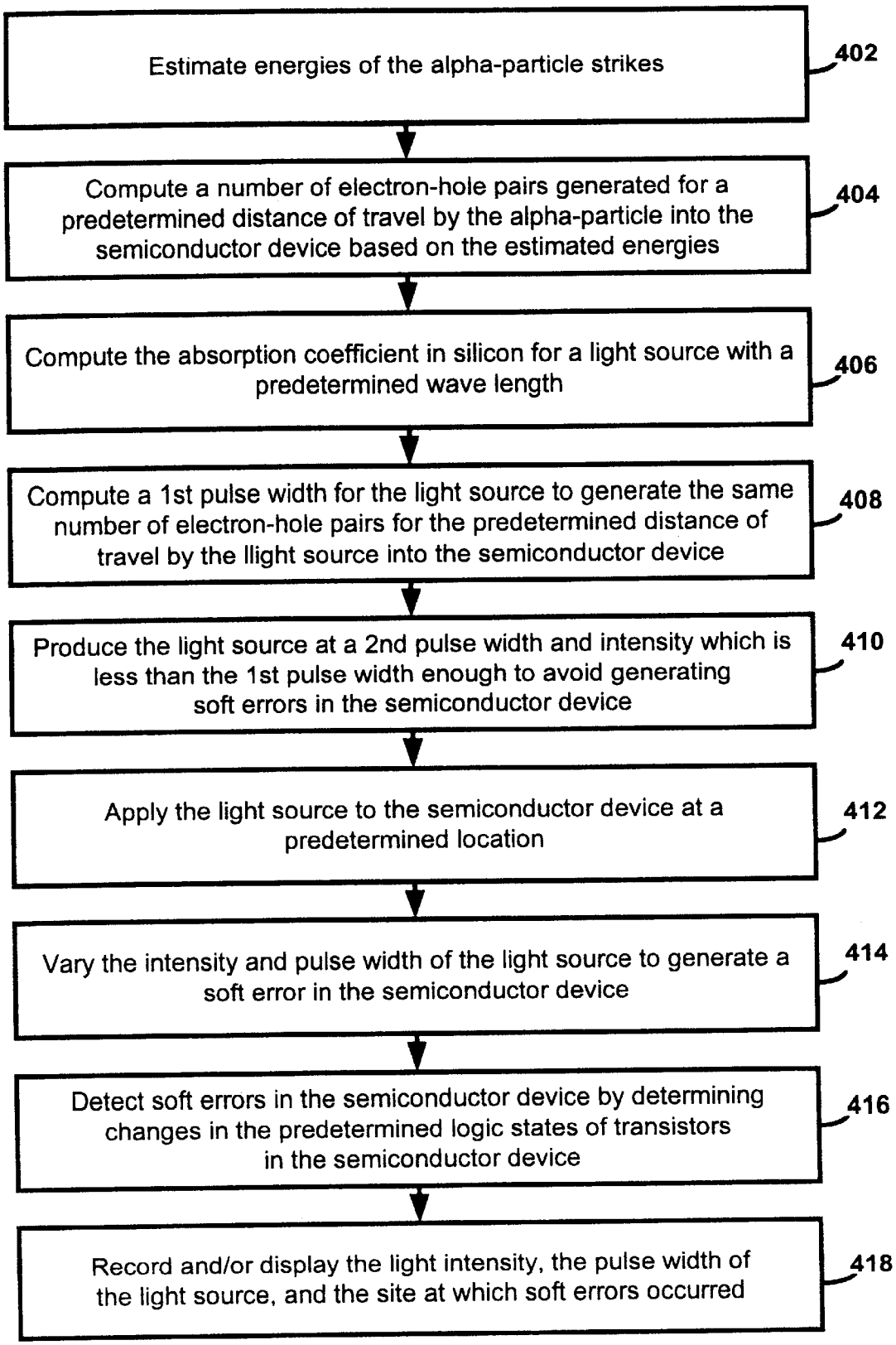
FIG. 4 is a block diagram of a method for determining the robustness of a device to alpha-particle/cosmic ray induced soft errors in accordance with the present invention.
Figure 5:
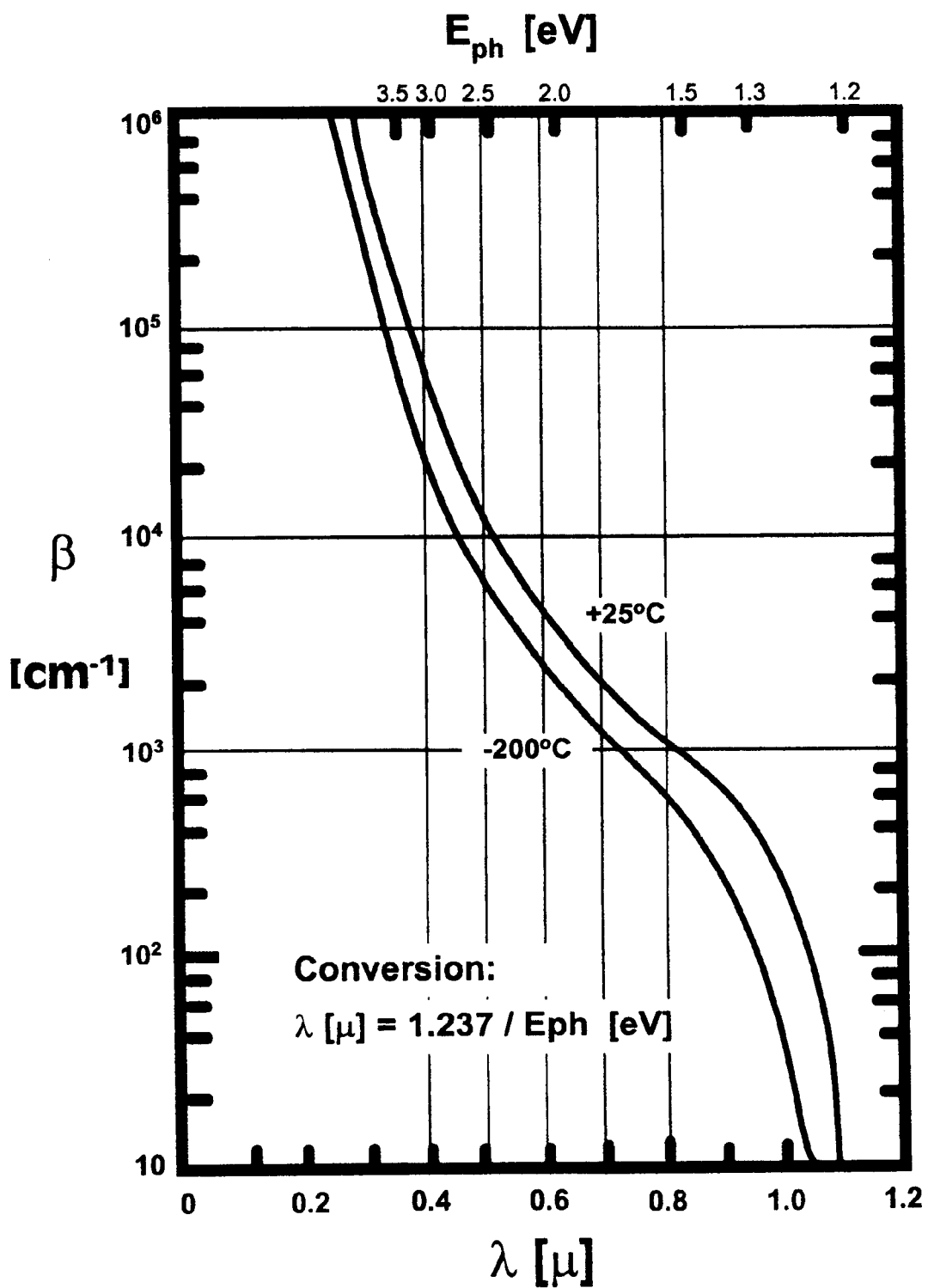
FIG. 5 is a graph showing the value of the absorption coefficient $\beta$ of a light pulse as a function of its wavelength $\lambda$.

A preferred method for operating the apparatus 300 in FIG. 3 will be discussed with reference to FIGS. 3–5. Referring now to FIG. 4, therein is shown a flowchart for determining the robustness of a memory device (not shown) in the semiconductor integrated circuit 318 (as shown in FIG. 3) to soft errors induced by alpha-particle and/or cosmic ray strike using the apparatus 300 in accordance with the present invention. For the purposes of discussion, it will be assumed that light source 302 is a laser source and light pulse 316 is a laser pulse.

The first step 402 of the present process entails estimating the energies of alpha-particles that may strike the memory cell.

In a second step 404, the processor 314 (as shown in FIG. 3) compares a number of electron-hole pairs generated for a predetermined distance of travel in the memory device by the alpha-particle. For example, a 1 MeV alpha-particle has energy equivalent to $8 \times 10^5$ light pulses which can generate $8 \times 10^5$ electron-hole pairs when it strikes a silicon junction such as the drain junction of the memory device. Similarly, a 5 MeV alpha-particle has energy equivalent to $4 \times 10^6$ light pulses. Since the range of alpha-particle penetration is approximately 20 μm in silicon, for a 2 μm travel (the depth of the depletion region at the drain junction of the memory device), the number of electron-hole pairs generated would be equal to $4 \times 10^5$.

In the next step 406, the processor 314 will compute the absorption coefficient (β) for the light pulse 316 (as shown in FIG. 3) with a predetermined wavelength. With reference to FIG.4, therein is shown a graph illustrating the value of β in silicon for a light pulse with respect to its wavelength λ. This graph is commonly known in the art and is available, for example, in a semiconductor databook entitled "Silicon Semiconductor Data" authored by Helmut F. Wolf of Signetics Corporation (Pergamon Press). The processor 314 can store this β versus λ relationship in a look-up table within the memories of the processor. In operation, the processor 314 can determine the value of β for any given value of ) by checking the look-up table. For example, in the case of a light pulse with a wavelength of approximately 0.9 μm, the graph in FIG. 5 shows a β value of approximately 200 cm$^{-1}$.

When a light pulse travels for a small distance in silicon, such as the depth of the depletion region around the drain junction (i.e., around 2 μm), the proportion of energy absorbed by the silicon is approximately equal to β*t, where t is the distance traveled (the light energy absorbed varies as $1-\exp(-\beta t)$ but if $\beta t \ll 1$, then $\exp(-\beta t) = 1-\beta t$. Thus, the amount of energy absorbed in the silicon when the light pulse travels through the depletion region of the drain junction is equal to:

$$\beta * t = 200 \text{ cm}^{-1} * 2 \times 10^{-4} \text{ cm} = .04 = 4\%$$

In the next step 408, the processor 314 will compute a first pulse width for the light pulse 316 to generate the same number in electron-hole pairs for the same predetermined distance of travel in the depletion region of the drain junction (i.e., 2 μm) as the alpha-particle. It is known that a near infrared 1 milliwatt (mW) laser emits $5 \times 10^{15}$ photons per second. Therefore the number of photons absorbed per second in 2 μm of silicon device (the drain depletion region) is equal to:

$$\beta * t * 5 \times 10^{15} = 0.04 * 5 \times 10^{15} = 2 \times 10^{14} \text{ per second.}$$

Therefore, a 10 nanosecond pulse of a 1 mW laser will generate: $1 \times 10^{-9}$ sec.$* 2 \times 10^{14}$/sec.$= 2 \times 10^6$ electron-hole pairs.

Accordingly, a 2 nanosecond pulse of a 1 mW laser will generate $4 \times 10^5$ electron-whole pairs which is equivalent to the number of electron-hole pairs generated by a 5 MeV alpha-particle as previously discussed. Therefore, a red or near-infrared light pulse will be able to produce the same number of electron-hole pairs as those generated by a 5 MeV alpha-particle.

In the next step 410, laser source 302 produces the light pulse 316. The light pulse 316 has a pulse width less than the first pulse width as determined in step 408 to avoid generating soft errors.

Next, in step 412, the light pulse 316 is applied to the memory device on the integrated circuit 318 at a predetermined location, such as the drain junction of one of the transistor in the memory device.

In the next step 414, the processor 314 controls the light pulse energy varying circuit 312 (as shown in FIG. 3) to increase the light pulse energy of the light pulse 306 slowly by adjusting the intensity and/or the pulse width of the light pulse 316 until a soft error is generated.

In step 416, the detecting circuit 310 detects the presence of soft errors by monitoring the change in logic state of the transistor in which the light pulse 316 is directed. When a change in logic state is detected, a soft error would have occurred.

In the final step 418, the processor 314 recorded the light intensity, the pulse width of the light pulse 316 that generated the soft error, and the site of the soft error.

Figure 6:
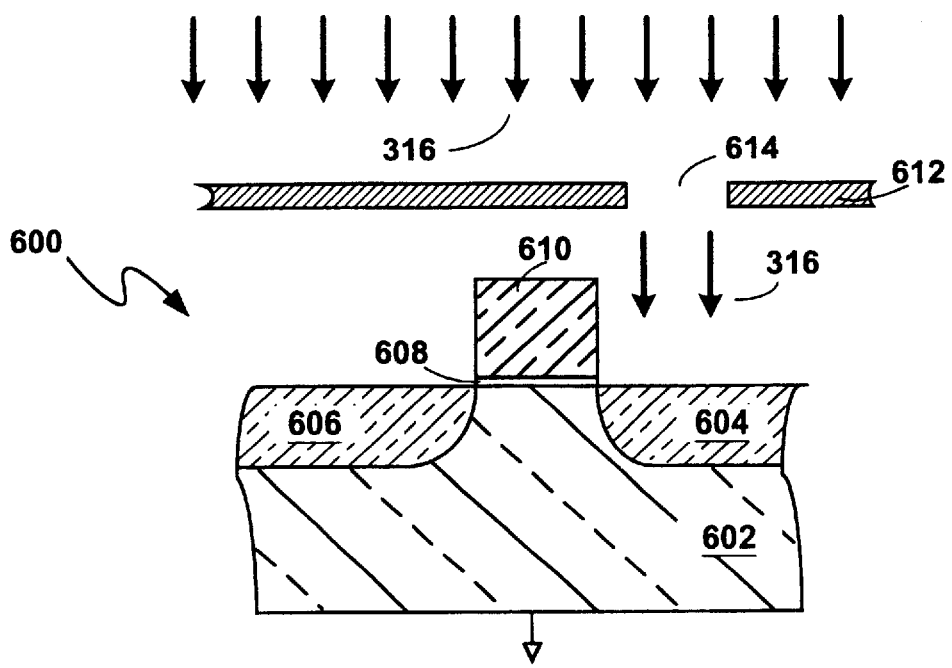
FIG. 6 is simplified illustration of a method for focusing a light pulse on to a predetermined location in a transistor in accordance with the present invention.

Referring now to FIG. 6, therein is shown the use of light pulse 306 to strike a transistor 600, such as one of the transistors used in a memory cell. In this embodiment, the light pulse 306 strikes the surface of transistor 600 with a 90° incident angle. The transistor 600 includes a silicon substrate 602. A drain junction 604, a source junction 606, and a thin layer of gate oxide 608 are shown disposed on the silicon substrate 602. A polysilicon gate 610 is disposed on the gate oxide 608. A metal mask 612 with an opening 614 is used to focus light pulse 316 so that it will strike at a predetermined location on the transistor 600. In FIG. 6, light pulse 316 will only strike the drain junction 604 of the transistor 600, whereas the polysilicon gate 610 and the source junction 606 are shielded from the light pulse 316 by 15 the metal mask 612. Using the metal mask 612, the light pulse 316 can be precisely focussed onto a very small, predetermined areas on an integrated circuit, such as the drain junction of a transistor in a memory cell. Therefore, in accordance with the present invention, alpha-particle strike can be accurately simulated by using a light pulse in conjunction with a metal mask which has openings that would expose predetermined location on a semiconductor device and allow the light pulse to be focused on such specific location.

Figure 7:
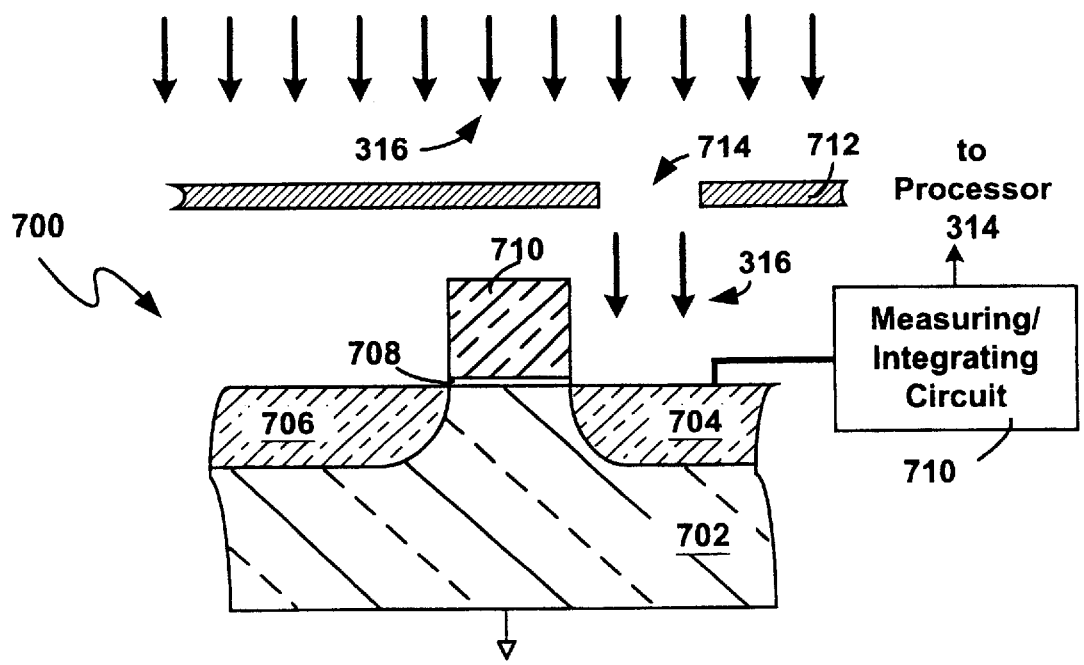
FIG. 7 is a simplified illustration of a method for determining $Q_c$ and for focusing a light pulse on to a predetermined location in a transistor in accordance with the present invention.

Referring now to FIG. 7, therein is shown the application of the light pulse 316 to strike a semiconductor diode 700. In this embodiment, the light pulse 316 strikes the surface of the diode 700 with a 90° incident angle. The diode 700 includes a silicon substrate 702. A drain junction 704, a source junction 706, and a thin layer of gate oxide 708 are shown disposed on the silicon substrate 702. A polysilicon gate 710 is disposed on the gate oxide 708. A metal mask 712 with an opening 714 is used to focus light pulse 316 so that it will strike at a predetermined location on the diode 700. In FIG. 7, light pulse 316 will only strike the drain junction 704 of the diode 700, whereas the polysilicon gate 710 and the source junction 606 are shielded from the light pulse 316 by the metal mask 712.

The arrangement in FIG. 7, in combination with the apparatus 300 as illustrated in FIG. 3, is used to compute $Q_c$ which is the amount of charge that will cause logic state reversal by causing a sufficiently large voltage disturbance in either DRAM or SRAM cells. The diode 700 is designed to have the same area and geometry as the drain junction 606 of the transistor 600. After the processor 314 has recorded the intensity and pulse width of the light pulse that would create a soft error in transistor 600 as illustrated in step 418 of FIG. 4 and in FIG. 6, a light pulse of the same energy (intensity and pulse width) is used to strike the drain junction of the diode 700. A measuring/integrating circuit 710 is coupled to process 314 and is used to measure the amount of current that flows through the drain junction 704 in response to the light pulse 316. The measuring/integrating circuit 710 then integrates the current and determines the amount of charge, (i.e., $Q_c$) that flows through the drain junction 706. Subsequently, the measuring/integrating circuit 710 outputs the value of $Q_c$ to the processor 314. Accordingly, $Q_c$ can be determined using the present invention. The critical charge $Q_c$ can be used as a quantitative measure to compare the robustness to alpha-particle and/or cosmic ray induced soft errors in different semiconductor devices and/or semiconductor devices with different structures or fabricated using different technologies.

Figure 8:
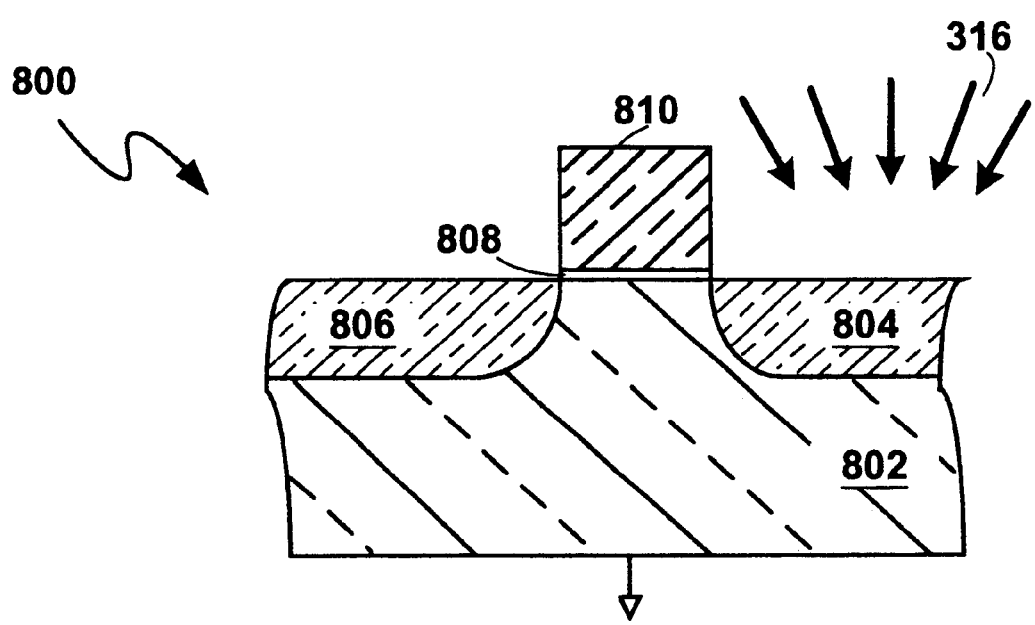
FIG. 8 is a simplified illustration of a method for determining the angle sensitive of a transistor to a light pulse (or alpha-particle with equivalent energy) in a transistor in accordance with the present invention.

Referring now to FIG. 8, therein is shown the application of the light pulse 316 at different incidence angles to a semiconductor transistor 800. The transistor 800 includes a silicon substrate 802. A drain junction 804, a source junction 806, and a thin layer of gate oxide 808 are shown disposed on the silicon substrate 802. A polysilicon gate 810 is disposed on the gate oxide 808. The apparatus 300 as depicted in FIG. 3 can be used to provide a light pulse with a different incident angle to the transistor 800. The angle of incidence can be adjusted by providing a relative rotational (θ) adjustment between the first fixture 304 and the second fixture 306. The light pulse energies (intensity and pulse width of the light pulse 316) needed to cause a soft error in different angle of incidence are recorded. The angle sensitivity of a device to the strike by light pulse 316 (or alpha-particles of equivalent energies) can be ascertained. The intensity and pulse width necessary to cause a soft error can be plotted as a function of the incidence angle in a three-dimensional graph. This information is helpful to integrated circuit and/or packaging engineers in designing integrated circuit that are less vulnerable to alpha-particle induced soft errors. For example, once the angle sensitivity of a device is known, the engineers can make an informed decision in the relative locations between the device in an integrated circuit and the alpha sources (such as lead bumps) in a package that house the integrated circuit.

In operation, to simulate and determine the robustness of memory cells such as SRAM 100 or DRAM 200 to alpha-particle induced soft errors, the apparatus 300 (as shown in FIG. 3) will be used.

The semiconductor integrated circuit 318 under test is mounted on the second fixture 306 as shown in FIG. 3. The power supply 308 is coupled to the integrated circuit 318 to provide power to the integrated circuit 318. The detecting circuit 310 is coupled to the integrated circuit 318 to detect the logic state of a memory device (not shown) within the integrated circuit 318.

The first step 402 of the present process entails estimating energies of an alpha-particle that is expected to strike the integrated circuit 318.

In a second step 404, the processor 314 in FIG. 3 compares a number of electron-hole pairs generated for a predetermined distance of travel in the memory device by the alpha-particle.

In the next step 406, the processor 314 will compute the absorption coefficient (β) for the light pulse 316 (as shown in FIG. 3) with a predetermined wavelength.

In the next step 408, the processor 314 will compute a first pulse width for the light pulse 316 to generate the same number in electron-hole pairs for the same predetermined distance of travel in the silicon junction (the depletion region in the drain junction) as the alpha-particle.

In the next step 410, laser source 302 produces the light pulse 316. The light pulse 316 has a pulse width less than the first pulse width as determined in step 408 and with a light pulse energy that is low enough to avoid generating soft errors.

Next, in step 412 the light pulse 316 is applied to the memory device on the integrated circuit 318 at a predetermined location, such as the drain region of one of the transistors in the memory device. At this stage, the first fixture 304 and the second fixture 306 are moved relative to each other in the X-Y-Z-θ direction so that the light pulse is focussed at the predetermined location. In one embodiment as shown in FIG. 3, the angle of incidence of the light pulse is 90°. A microscope may be used to aid the focusing of the light pulse 316 on to the predetermined location on the integrated circuit 318. In addition, a metal mask 612 with an opening 614 which exposes the predetermined location on the integrated circuit 318 (as shown in FIG. 6) can be used to direct the light pulse so that the light pulse 316 only strikes the predetermined location. The metal mask 612 may be built and aligned during the fabrication of the integrated circuit 318. Therefore, in accordance with the present invention, the metal mask 612 allows the use of a conventional laser source to generate a light pulse with a light spot that is bigger than the areas of the predetermined location on the integrated circuit 318.

In the next step 414, the processor 314 controls the light pulse energy varying circuit 312 (as shown in FIG. 3) to increase the light pulse energy of the light pulse 316 slowly by adjusting the intensity and/or the pulse width of the light pulse 316 until a soft error is generated.

In step 416, detecting circuit 314 detects the presence of soft errors by monitoring the change in logic state of the transistor at which the light pulse 316 is directed. When a change in logic state is detected, a soft error would have occurred.

In the final step 418, the processor 314 recorded and/or displayed the intensity and the pulse width of the light pulse 316 that generated the soft error. The intensity and the pulse width of the light pulse 316 that generated the soft error is a qualitative indication of the robustness of the memory cell to alpha-particle and/or cosmic ray induced soft error. This qualitative indication can be used as a tool for comparing the robustness to alpha-particle and/or cosmic ray induced soft error of different devices and/or devices that have different designs and/or are fabricated using different technologies.

To assist in making the comparisons, or just generally understanding the qualitative indications, the information could be displayed in a number of different formats. For example, contour maps could be used. For design, the contour maps could be superimposed on future circuit layouts.

In another embodiment of the present invention, the light pulse 316 strikes the surface of diode 700 at a 90° incident angle as shown in FIG. 7. A metal mask 712 with an opening 714 is used to focus light pulse 316 so that it will strike a predetermined location on the diode 700, i.e., the drain junction 704 of the diode 700. As explained previously, diode 700 is designed to have the same area and geometry as the drain junction 606 of the transistor 600. After the processor 314 has recorded the intensity and pulse width of the light pulse that created a soft error in transistor 600 as illustrated in step 418 of FIG. 4 and in FIG. 6, a light pulse of the same energy (intensity and pulse width) is used to strike the drain junction of the diode 700. The measuring/integrating circuit 710 is used to measure the amount of current that flows through the drain junction 704 in response to the light pulse 316. The measuring/integrating circuit 710 then integrates the current and determines the amount of charge, (i.e., $Q_c$) that flows through the drain side 706. Accordingly, $Q_c$ can be determined using the present invention. The critical charge $Q_c$ can be used as a quantitative indication of robustness of a device to alpha-particle and/or cosmic ray strikes. This qualitative indication can be used as a tool for comparing the robustness to alpha-particle and/or cosmic ray induced soft error of different devices and/or devices that have different designs and/or are fabricated using different technologies.

In yet another embodiment, as shown in FIG. 8, the angle of incidence of the light pulse 316 is adjusted to any angle between about 0° to about 180°. The angle of incidence can be adjusted by providing a relative rotational (θ) adjustment between the first fixture 304 and the second fixture 306. The light pulse energies (intensity and pulse width of the light pulse 316) needed to cause a soft error at different angle of incidence are recorded. As explained previously, the information about angle sensitivity of a device to the strike by light pulse 316 (or alpha-particles of equivalent energies) is helpful to integrated circuit and/or packaging engineers in designing integrated circuits that are less vulnerable to alpha-particle induced soft errors.

Accordingly, the present invention describes various embodiments which provide inexpensive methods and apparatus that would accurately simulate an alpha-particle and/or cosmic ray strike in predetermined areas of a memory cell, with repeatable results. The present invention uses conventional light sources with sizes that can be easily accommodated in a semiconductor manufacturing facility or laboratory. Furthermore, the present invention provides a method that can be used to focus the light pulse at a predetermined location on a memory cell.

While the best mode uses a laser source as the light source, other light sources which provide light pulses, such as collimated light pulses, with light pulse energies sufficient to induce soft errors in a device are applicable to determine the robustness of the device to alpha-particle and/or cosmic ray induced soft errors.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for determining the robustness of a device to soft errors generated by alpha-particle and/or cosmic ray strikes, comprising the steps of:

estimating energies of the alpha-particle and/or cosmic ray strikes;

computing a number of electron-hole pairs generated for a predetermined distance of travel by the alpha-particle and/or cosmic ray into the device based on said estimated energies;

computing the absorption coefficient in silicon for a light pulse with a predetermined wavelength;

computing a first pulse width for said light pulse to generate said number of electron-hole pairs for said predetermined distance of travel by said light pulse into the device;

producing said light pulse, said light pulse having a light pulse energy which is controlled by a pulse width and an intensity, wherein said pulse width is at a second pulse width which is less than said first pulse width and said light pulse energy is at a first light pulse energy which is low enough to avoid generating soft errors in the device;

applying said light pulse to the device at a predetermined location;

varying said light pulse energy to a second light pulse energy to generate a soft error; and detecting a soft error in the device.

2. The method as claimed in claim 1 wherein said device is a semiconductor device and wherein:

said step of applying said light pulse applies a collimated light pulse.

3. The method as claimed in claim 1 wherein:

said step of applying said light pulse applies a laser pulse.

4. The method as claimed in claim 1 wherein:

said step of applying said light pulse to the device forms a light spot on the device, said light spot having a first size; and said step of applying said light pulse further includes a step of covering a portion of the device in the vicinity of said predetermined location with a mask having a size that is equal to or bigger than said first size, said mask has an opening that is directly above said predetermined location to expose said predetermined location prior to the step of applying said light pulse to the device, and said mask blocks said light pulse from reaching said portions of the device that are covered by said mask.

5. The method as claimed in claim 1 wherein:

said step of varying said light pulse energy includes a step of adjusting said intensity, said pulse width, or a combination thereof.

6. The method as claimed in claim 1 wherein the device includes at least one said transistor at a predetermined logic state and wherein:

said step of detecting step said soft error includes a step of determining changes in said predetermined logic state of the at least one transistor.

7. The method as claimed in claim 1 wherein the device includes at least one transistor having a drain and a source junction and wherein:

said step of applying said light pulse applies said light pulse at said predetermined location at the drain junction of the at least one transistor.

8. A method for determining the robustness of a semiconductor device to soft errors generated by alpha-particle and/or cosmic ray strikes, wherein the device includes a transistor at a predetermined logic state, comprising the steps of:

estimating energies of the alpha-particle and/or cosmic ray strikes;

computing a number of electron-hole pairs generated for a predetermined distance of travel by the alpha-particle and/or cosmic ray into the semiconductor device based on said estimated energies;

computing the absorption coefficient in silicon for a light pulse with a predetermined wavelength;

computing a first pulse width for said light pulse to generate said number of electron-hole pairs for said predetermined distance of travel by said light pulse into the semiconductor device;

producing said light pulse, said light pulse having a light pulse energy which is controlled by a pulse width and an intensity, wherein said pulse width is at a second pulse width which is less than said first pulse width and said light pulse energy is at a first light pulse energy which is low enough to avoid generating soft errors in the semiconductor device;

applying said light pulse to the semiconductor device at a predetermined location;

varying said light pulse energy to a second light pulse energy to generate a soft error; and detecting said soft error in the semiconductor device by determining a change in the predetermined logic state of the transistor.

9. The method as claimed in claim 8 wherein:

said step of applying said light pulse forms a light spot on the device, said light spot having a first size; and said step of applying said light pulse further includes a step of covering portions of the device in the vicinity of said predetermined location with a mask having a size that is equal to or bigger than said first size, said mask having an opening that is directly above said predetermined location to expose said predetermined location prior to said step of applying said light pulse and said mask blocks said light pulse from reaching said portions of the device that are covered by said mask.

10. The method as claimed in claim 8 wherein said step of varying light pulse energy includes a step of adjusting said intensity, said pulse width, or a combination thereof.

11. The method as claimed in claim 8 wherein the transistor has a drain and a source junction, and wherein:

said step of applying said light pulse at said predetermined location includes providing said light pulse at the drain junction of the transistor.

12. A method for determining the robustness of a semiconductor device to soft errors generated by alpha-particle and/or cosmic ray strikes, wherein the device includes a plurality of transistors with each of the plurality of transistors at a predetermined logic state, comprising the steps of:

estimating energies of the alpha-particle and/or cosmic ray strikes;

computing a number of electron-hole pairs generated for a predetermined distance of travel by the alpha-particle and/or cosmic ray into the semiconductor device based on said estimated energies;

computing the absorption coefficient in silicon for a light pulse with a predetermined wavelength;

computing a first pulse width for said light pulse to generate said number of electron-hole pairs for said predetermined distance of travel by said light pulse into the semiconductor device;

producing said light pulse, said light pulse having a light pulse energy which is controlled by a pulse width and an intensity, wherein said pulse width is at a second pulse width which is less than said first pulse width and said light pulse energy is at a first light pulse energy which is low enough to avoid generating soft errors in the semiconductor device;

applying said light pulse to the semiconductor device at a predetermined location;

varying said light pulse energy to a second light pulse energy by adjusting said intensity and said pulse width to generate a soft error, said second light pulse energy in higher than said first light pulse energy; and detecting soft errors in the semiconductor device by determining changes in the predetermined logic states of each of the plurality of transistors.

* * * * *